United States Patent [19]

Rhodes

[11] 4,373,203
[45] Feb. 8, 1983

[54] CIRCUIT ARRANGEMENT AND METHOD FOR ASSESSING COMMUNICATION ACTIVITY ON A PARTICULAR RADIO COMMUNICATION CHANNEL

[75] Inventor: Stephen L. Rhodes, Reading, England

[73] Assignee: Racal Communications Equipment Limited, Bracknell, England

[21] Appl. No.: 189,146

[22] Filed: Sep. 22, 1980

[30] Foreign Application Priority Data

Sep. 28, 1979 [GB] United Kingdom ............... 7933705

[51] Int. Cl.³ .......................................... H04B 1/10
[52] U.S. Cl. ...................................... 375/10; 375/99
[58] Field of Search ............. 455/296, 306, 307, 311, 455/1; 375/10, 99, 101, 103, 104; 364/572, 574; 358/36, 167; 328/162–167, 150; 324/326

[56] References Cited

U.S. PATENT DOCUMENTS

| 3,688,131 | 8/1972 | Hirsch | 328/150 |
| 3,795,861 | 3/1974 | Lazenby | 324/336 |
| 3,932,818 | 1/1976 | Masak | 375/103 |
| 3,988,679 | 10/1976 | Clarke | 375/104 |
| 4,143,333 | 3/1979 | Jacobsen | 328/165 |

Primary Examiner—Benedict V. Safourek
Assistant Examiner—Stephen Chin
Attorney, Agent, or Firm—Leydig, Voit, Osann, Mayer & Holt, Ltd.

[57] ABSTRACT

A circuit for rapidly assessing communications activity on a particular radio channel being jammed has a filter tuned to the receiver IF and to the input of which the incoming signal (at the receiver IF) is switched. The waveform of the resultant filter output for the signal on the particular channel—that is, falling within the filter passband—is produced in conjunction with interfering signals in adjacent channels. It is shown that the nulls in the waveform of the interfering signals occur at time instants dependent on the passband of the filter, not on the frequency of the interfering signals. The circuit therefore is timed to measure the level of the filter output at the instant of one or more of the nulls of the interfering signals, thus avoiding interference by the latter.

7 Claims, 3 Drawing Figures

CIRCUIT ARRANGEMENT AND METHOD FOR ASSESSING COMMUNICATION ACTIVITY ON A PARTICULAR RADIO COMMUNICATION CHANNEL

BACKGROUND OF THE INVENTION

The invention relates to radio communications and more specifically to arrangements for assessing communications activity on a particular radio channel. The invention has applicability to systems for jamming radio transmission in that it enables communications activity on a particular channel to be assessed during a short period for which jamming is temporarily interrupted—so as to enable a decision to be made whether to continue with jamming.

BRIEF SUMMARY OF THE INVENTION

According to the invention, there is provided a circuit arrangement responsive to an input signal for assessing the level of the signal within a predetermined passband, comprising a passband filter tuned to the predetermined passband, means for switching the input signal into the filter, and means for assessing the level of the filter at at least one predetermined instant in time at which transient signals due to frequencies present in the input signal but outside the passband are at a minimum.

According to the invention there is also provided a circuit arrangement for assessing the level in an input signal of the radio communications activity in a predetermined radio communications channel, comprising a passband filter tuned to pass signals corresponding to the predetermined channel, switch means for repeatedly applying the input signal to the filter for predetermined periods of time, time delay means responsive to the switch means for establishing a predetermined time delay following each application of the input signal to the filter by the switch means, the predetermined time delay being characteristic of the filter and being the time required for frequencies present in the input signal but lying outside the passband of the filter to reach a maximum level, and assessment means operative after the end of the time delay, and at at least one instant in time at which transient signals due to frequencies present in the input signal but outside the passband are at a minimum, to assess the output of the filter.

DESCRIPTION OF THE DRAWINGS

Electrical circuit arrangements embodying the invention for assessing communications activity on a particular channel and embodying the invention, will now be described with reference to the accompanying diagrammatic drawings in which.

DESCRIPTION OF PREFERRED EMBODIMENTS

The circuit arrangement to be described comprises a radio receiver arranged to assess and control jamming of radio transmission in a particular communications channel. The circuit arrangement periodically interrupts the jamming activity and then assesses the communications activity on the particular channel and makes, a decision, depending on the level of transmission, whether or not to continue with the jamming. The period during which jamming is interrupted is termed the "look-through period" and clearly it should be as short as possible so as to prevent unjammed communication taking place on that channel.

Figure 1:
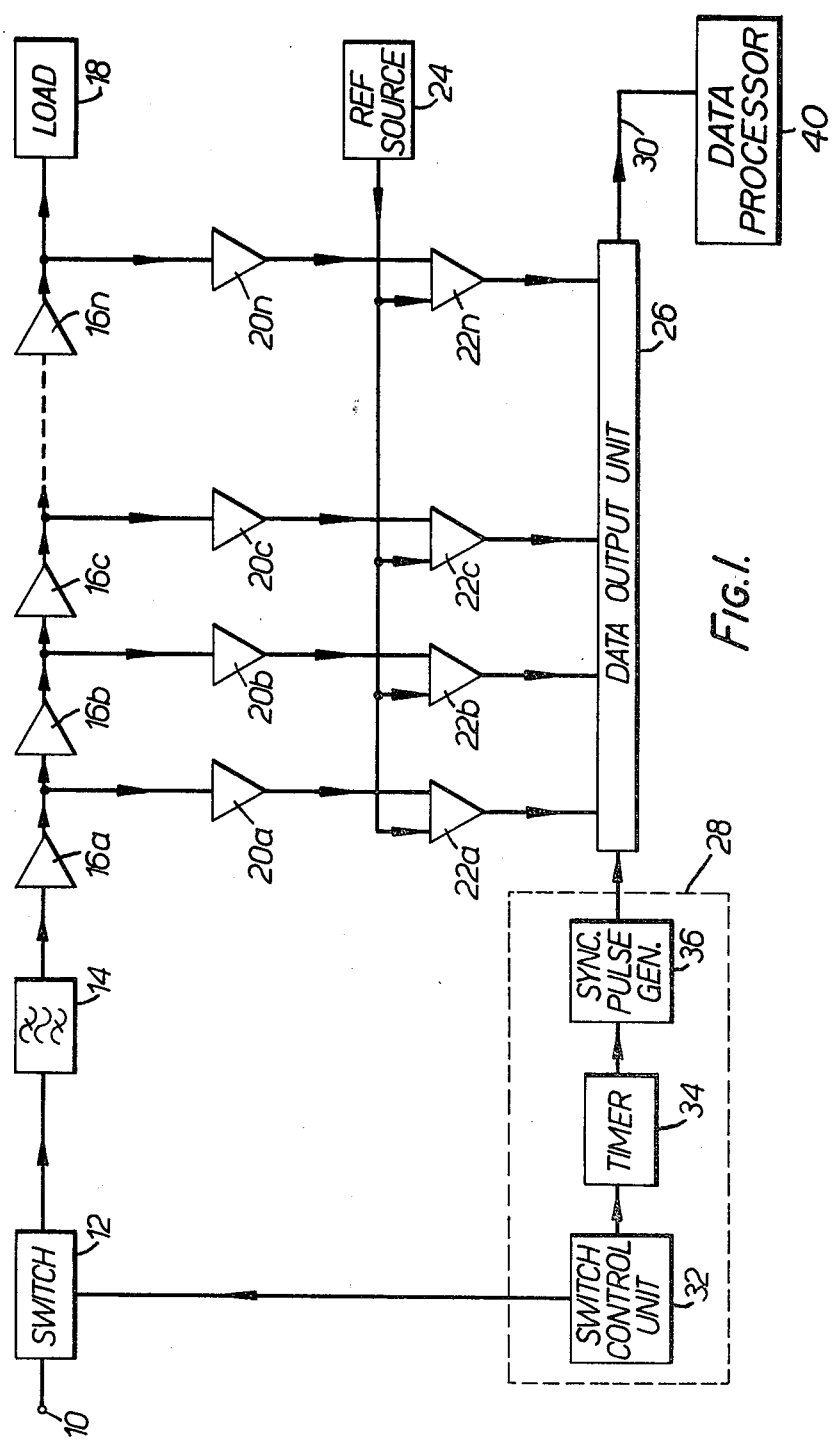
FIG. 1 is a block circuit diagram of the arrangement.

As shown in FIG. 1, the circuit arrangement has an input terminal 10 which receives, at the receiver intermediate frequency, radio frequency signals picked up by the receiver. Through a rapidly acting electronic switch 12 (such as a PIN diode switch), the signals are passed through a passband filter 14 tuned to the intermediate frequency. The filter output is then passed through a chain of n cascade-connected amplifiers 16a, 16b, 16c . . . 16n each having a gain of, in this example, 10 db, the chain being terminated by a 50 ohm load 18. The output of each amplifier is detected by a respective detector 20a, 20b, 20c . . . 20n and the d.c. outputs of the detectors are fed into respective comparators 22a, 22b, 22c . . . 22n each of which compares this level with a reference level provided by a reference level source 24. Each comparator therefore produces a binary output indicating whether or not the d.c. level which it receives from the corresponding detector is greater than the reference level. The data bits are fed into a data output unit 26, and, in a manner to be described, a synchronising and gating unit 28 activates the unit 26 periodically to feed the stream of data bits to a data processor (not shown) on a line 30.

The synchronising and gating unit 28 also controls the switch 12.

When the switch 12 is closed, the IF signal from the receiver will be suddenly applied to the filter 14. However, the output of the filter will not to start with represent the level of any communications activity on the particular channel. Furthermore, the filter will also produce, during an initial period after switching, transient outputs in response to any other radio frequency activity, if present, lying outside the passband of the filter. These transients will therefore affect the total level of the output of the filter. These effects have to be taken into account when monitoring the output of the filter 14, and, in a manner to be described, the circuit arrangement takes these factors into account in a way which enables assessment of the level of the communications activity on the particular channel with minimum delay, that is, without the necessity to wait for the transients to die away to a minimum.

Figure 2:
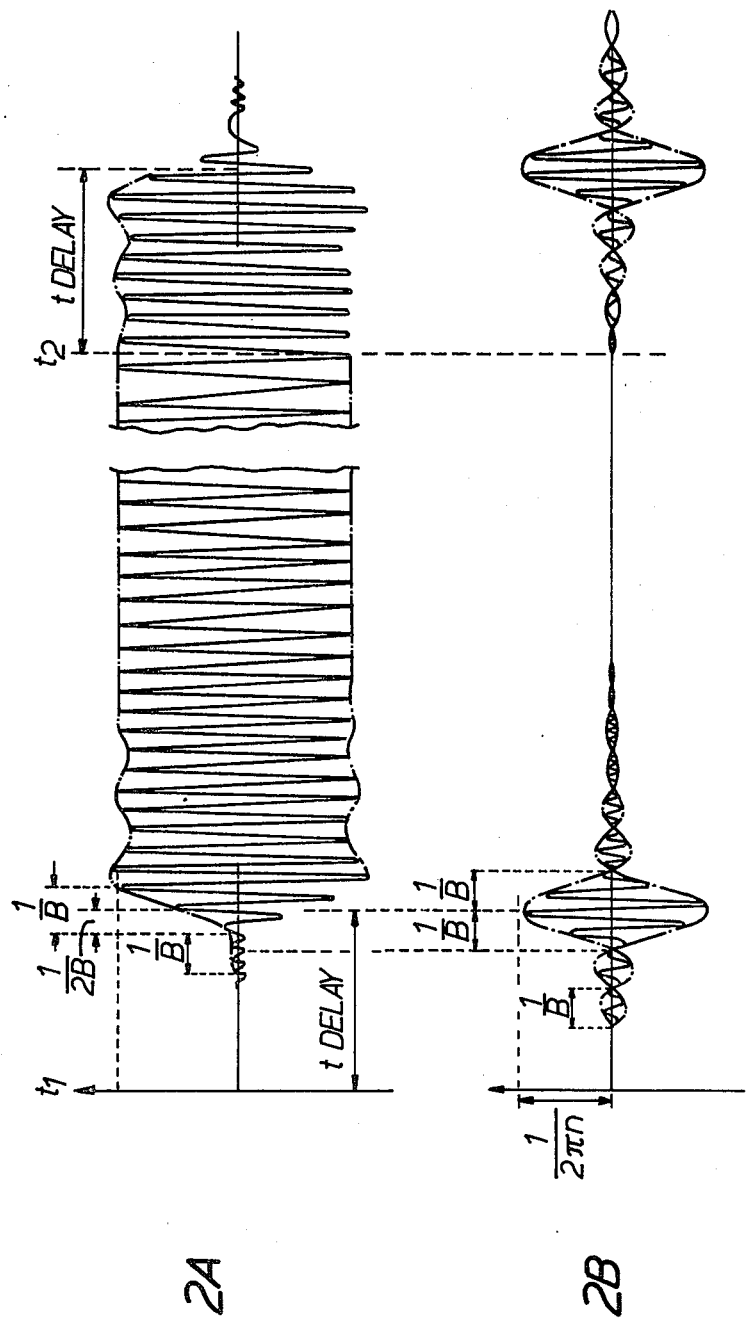
FIG. 2, including A and B, shows two waveforms to aid in explaining the operation of the circuit arrangement.

The waveforms of FIG. 2 illustrate the effects in more detail.

FIG. 2A shows the output of the filter 14 in response solely to a signal lying within the bandwidth of the filter. It is assumed that the switch 12 is closed at time instant $t_1$ and is open again at a time $t_2$. In FIG. 2, B represents the bandwidth of the filter in hertz, and $t_d$ is the time delay of the filter which is a characteristic of its design.

FIG. 2B shows the output of the filter when a signal lying outside the bandwidth of the filter is applied (alone) to the filter. Some background theory relating to the waveform of FIG. 2B (and that of FIG. 2A) is given below in an Appendix, but it can be shown that, in the waveform of FIG. 2B, the frequency of oscillation under the envelope is the centre frequency of the filter and is not the frequency of the applied signal. Furthermore, the maximum value of the output is proportional to the bandwidth of the filter and inversely proportional to the number of filter bandwidths by which the signal is spaced from the centre frequency of the filter. The positions of the nulls of the envelope are substantially independent of the actual value of the applied frequency and will therefore be the same for all applied signals lying outside the filter bandwidth. As the system is linear, the application of a number of sinusoidal signals (of different frequency), all lying outside the passband of the filter, will produce a total output given by the sum of the transients which would be produced if each signal was applied separately. In addition, of course, the total output will have added to it the waveform of any signal lying within the filter bandwidth (as shown in FIG. 2A). FIGS. 2A and 2B therefore show that it is not practicable to attempt to measure the level of the communications activity on the predetermined channel simply by closing the switch and then immediately monitoring the output of the filter 14. Account must be taken of the time required for the signal within the filter passband to build up to its maximum level. More importantly, however, account also needs to be taken of transient signals produced at the filter output due to the inputs at frequencies outside the filter bandwidth. The latter signals will decay but if assessment of the level of the signal on the predetermined channel is delayed until the signals outside the passband have decayed sufficiently, the length of the look-through period would be substantially increased. However, the circuit arrangement being described enables the level of communications activity on the particular channel to be assessed without waiting for the interfering transients to decay.

As shown in FIG. 2B, the level of the transient signal has regular nulls spaced apart at 1/B seconds. Therefore, in accordance with a feature of the invention, the circuit arrangement samples the output of the filter at the instant of one or more of these nulls and in this way only the amplitude of the wanted signal is observed.

Figure 3:
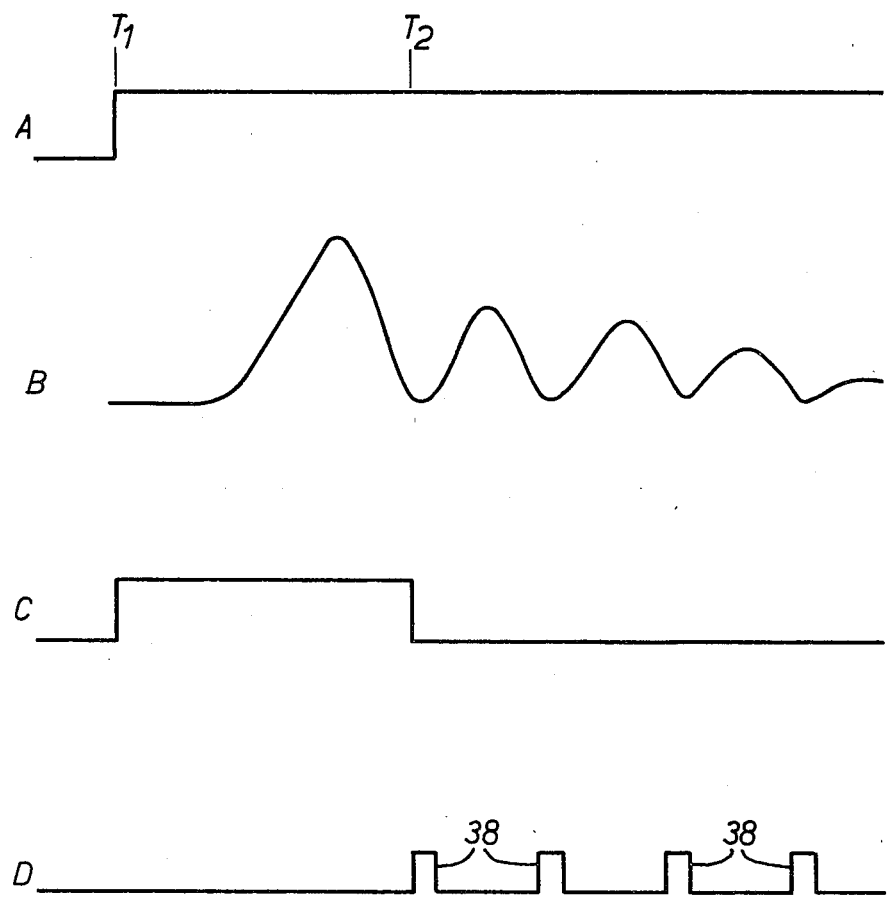
FIG. 3, including A through D, shows waveforms occurring in the circuit arrangement.

As shown in FIGS. 1 and 3, the synchronising and gating unit 28 includes a switch control unit 32 which periodically operates to close the switch 12 and to maintain it closed for a predetermined length of time. As shown in FIG. 3A, the switch 12 is closed at instant $T_1$. The IF input at terminal 10 is therefore applied to the filter 14 and the filter therefore produces a composite output, made up of the waveform (FIG. 2A) of any signal within the filter passband together with a transient signal made up of the sum of waveforms (FIG. 2B) produced by signals lying outside the passband. The composite output is amplified by the chain of amplifiers 16a, 16b, 16c ... 16n and their outputs are detected and compared with the reference level in the comparators 22a, 22b, 22c ... 22n. Closure of the switch 12 by the switch control unit 32 activates a timing circuit 34 having a period ending at time $T_2$ (FIG. 3C). At this time, the timing circuit activates a sync pulse generator 36 which produces synchronising pulses 38 (FIG. 3D) which are synchronised with the nulls in waveform 2B in FIG. 2 and thus have a period of 1/B. Each sync pulse causes the data output unit 26 to sample the digital outputs of the comparators and to feed the resultant train of bits to the data processor 40 on line 30. The train of data bits will represent the magnitude of the filter output at the instant of each sync pulse, because the magnitude of this output will determine how many of the chain of amplifiers 16a, 16b, 16c ... 16n saturate. The data processor is therefore able to assess the magnitude of the communications activity on the predetermined channel, without interference from transient signals, and to make a determination whether to continue with jamming. It may be practicable for the data processor to make this assessment merely on the basis of one set of data bits (that is, after the occurrence of one sync pulse). However, it may be more practicable for the data processor to make several assessments before coming to its final decision. Nevertheless, it is possible for the data processor to make its assessment within a look-through period having a total length of the order of 1 or 2 milliseconds—and this time is completely independent of transients produced by signals outside the passband. This contrasts with a time delay of, say, 60 milliseconds, which might be necessary in a system subjected to a $-10$ dBm interfering signal and which has to wait until the interfering signal has decayed sufficiently (down to say $-100$ dBm).

It should be noted that FIGS. 2A and 2B do not necessarily show the relative magnitudes likely to occur in practice of signals inside and outside the filter passband. Signals outside the passband will of course be attenuated by the filter but on the other hand they may originate from a transmitter much closer to the receiver then the source of the signal being monitored and will thus be relatively strong.

The circuit shown in FIG. 1 is merely one of various possible circuits which can be used for monitoring the output of the filter 14 and assessing its level at the nulls of the transient signals.

APPENDIX

Background Theory of FIGS. 2A and 2B

FIG. 2A shows the waveform when the applied signal $f_i$ falls within the filter bandwidth. FIG. 2B shows the waveform when the applied signal of frequency $f_1$, phase $\alpha$, falls outside the filter bandwidth. If the filter is assumed to be perfect, the response for both of these cases may be represented by linear equations. For the first condition (FIG. 2A) the voltage output for a unity amplitude signal can be shown to be:

$$V = (1/\pi)[SiB\pi(t-t_1-t_d) - SiB\pi(t-t_2-t_d)]\cos(\omega_0 t + \alpha) \quad (1)$$

where $$Si(x) = \int_0^x \frac{\sin\omega_0 t}{t} dt,$$

$t_d$ = filter time delay
and $\omega_0 = 2\pi fc$

When the applied signal falls outside the filter passband (FIG. 2B), there is a transient signal produced which, assuming $|f_1 - f_c| \gg B$, can be shown to be described by the equation:

$$V_o = (1/2\pi n) \text{sinc } B\pi(t-t_1-t_d)\cdot\sin(\omega_0 t - 2\#nBt_1 + \alpha)(1/2\pi n)\text{sinc } B\pi(t-t_2-t_d)\cdot\sin(\omega_0 t - 2\pi nBt_2 + \alpha) \quad (2)$$

where
sinc $x$ = sin $x/x$,
$n$ = number of filter bandwidths (B) by which the applied frequency is spaced from the centre frequency (fc) of the filter, and
$\omega_0 = 2\pi fc$.
What is claimed is:

1. A circuit arrangement responsive to an alternating input signal for assessing the level of the signal within a predetermined passband, comprising a passband filter tuned to the predetermined passband, means for switching the input signal into the filter at a time $t_1$, means for providing a time delay of a predetermined length beginning at $t_1$, means for selectively sampling the level of the output signal of the filter, said sampling means being coupled to time delay means so as to be operative at at least one predetermined instant in time which is after the end of said time delay and which is selected such that the magnitude of the envelope of the transient signals due to frequencies present in the output signal of the filter but outside the passband is temporarily at a minimum, and means for assessing the level of the output of the filter at the or each said time instant thereby to assess the level of the signal within the predetermined passband while avoiding interference from signals outside the passband.

2. A circuit arrangement for assessing the level in an input signal of the radio communications activity in a predetermined radio communications channel, comprising a passband filter tuned to pass signals corresponding to the predetermined channel, switch means for repeatedly applying the input signal to the filter for predetermined period of time, time delay means responsive to the switch means for establishing a predetermined time delay following each application of the input signal to the filter by the switch means, the predetermined time delay being characteristic of the filter and being the time required for frequencies present in the input signal but lying outside the passband of the filter to reach a maximum level, and selective sampling means coupled to the time delay means so as to be operative for sampling the level of the output signal of the said filter after the end of the time delay, and at at least one instant in time at which the magnitude of the envelope of the transient signals due to frequencies present in the input signal but outside the passband is temporarily at a minimum, and means for assessing the level of the output of the filter at the or each said time instant, thereby to assess the level of the signal within the predetermined passband while avoiding interference from signals outside the passband.

3. A circuit arrangement according to claim 2, in which the said time instant is spaced from the end of the time delay by a length of time given by 1/B, where B is the bandwidth of the filter in hertz.

4. A circuit arrangement according to claim 2 or 3, in which the assessment means assesses the level of the output of the filter at a plurality of instants following the end of each time delay, each instant being spaced from the preceding one by 1/B.

5. A circuit arrangement according to claim 4, in which the assessment means comprises a chain of cascade-connected amplifiers of predetermined gain so that the number of amplifiers in the chain which are saturated by the output of the filter depends on the level of that output, means for comparing the output of each amplifier with a predetermined reference level whereby to produce a respective binary signal indicating whether or not that amplifier output is above the reference level, and means for monitoring the values of the binary signals at the or each said time instant.

6. A method for assessing the level of an alternating input signal within a predetermined passband, comprising the steps of switching the input signal into a filter having the predetermined passband at a time $t_1$, selectively sampling the level of the output of the filter at at least one predetermined instant in time delayed by a predetermined interval from $t_1$ at which the magnitude of the envelope of the transient signals due to frequencies present in the input signal but outside the passband is temporarily at a minimum, and assessing the level of the output of the filter at the or each said time instant, thereby to assess the level of the signal within the predetermined passband while avoiding interference from signals outside the passband.

7. A method for assessing the level in an input signal of the radio communications activity in a predetermined radio communications channel, comprising the steps of repeatedly applying the input signal for predetermined periods of time to a filter having the predetermined passband corresponding to the predetermined channel, establishing a predetermined time delay following each application of the input signal to the filter, the predetermined time delay being characteristic of the filter and being the time required for frequencies present in the input signal but lying outside the passband to reach a maximum level, selectively sampling the output of the filter after the end of the time delay and at at least one instant in time at which the magnitude of the envelope of the transient signals due to frequencies present in the input signal but outside the passband is temporarily at a minimum, and assessing the level of the output of the filter at the or each said time instant thereby to assess the level of the signal within the predetermined passband while avoiding interference from signals outside the passband.

* * * * *

UNITED STATES PATENT AND TRADEMARK OFFICE
CERTIFICATE OF CORRECTION

PATENT NO. : 4,373,203
DATED : February 8, 1983
INVENTOR(S) : Stephen L. Rhodes

It is certified that error appears in the above—identified patent and that said Letters Patent is hereby corrected as shown below:

Column 4, line 59, after the first parenthetical equation,
    a minus should be inserted, -- - --;

Column 4, line 59, delete "#" and insert -- $\pi$ -- (pi).

Signed and Sealed this

Seventh Day of June 1983

[SEAL]

Attest:

DONALD J. QUIGG

*Attesting Officer*     *Acting Commissioner of Patents and Trademarks*